United States Patent [19]

Crivello

[11] 4,139,385
[45] Feb. 13, 1979

[54] COATING METHOD AND COMPOSITION USING CATIONIC PHOTOINITIATORS POLYTHIO COMPONENTS AND POLYOLEFIN COMPONENTS

[75] Inventor: James V. Crivello, Clifton Park, N.Y.

[73] Assignee: General Electric Company, Schenectady, N.Y.

[21] Appl. No.: 759,327

[22] Filed: Jan. 14, 1977

Related U.S. Application Data

[63] Continuation-in-part of Ser. No. 588,636, Jun. 20, 1975, abandoned.

[51] Int. Cl.$^2$ .................................................. G03C 1/68
[52] U.S. Cl. .................................. 96/35.1; 96/115 R; 96/115 P; 204/159.18; 204/159.23; 204/159.24
[58] Field of Search .................... 96/115 P, 115 R; 204/159.18, 159.23, 159.24

[56] References Cited

U.S. PATENT DOCUMENTS

| | | | |
|---|---|---|---|
| 3,697,396 | 10/1972 | Kehr et al. | 204/159.14 |
| 3,697,402 | 10/1972 | Kehr et al. | 204/159.14 |
| 3,700,574 | 10/1972 | Kehr et al. | 204/159.14 |

OTHER PUBLICATIONS

Kehr et al., "Thiol/ene Curable Polymer Technology" Division of Organic Coating and Plastic Chemistry, vol. 3, No. 1, Apr. 8–13, 1975.

*Primary Examiner*—Jack P. Brammer
*Attorney, Agent, or Firm*—William A. Teoli; Joseph T. Cohen; Charles T. Watts

[57] ABSTRACT

A coating method is provided based on the use of a UV curable mixture of a polyolefin and a polythiol having an onium salt photoinitiator. There are also provided, ultraviolet radiation curable compositions useful as coating compositions.

10 Claims, No Drawings

COATING METHOD AND COMPOSITION USING CATIONIC PHOTOINITIATORS POLYTHIO COMPONENTS AND POLYOLEFIN COMPONENTS

This application is a continuation-in-part application of copending application Ser. No. 588,636, filed June 20, 1975 now abandoned and assigned to the same assignee as the present invention.

The present invention relates to ultraviolet radiation curable compositions having a polyolefin component and a polythiol component and an effective amount of a photoinitiator. The present invention also relates to a coating method involving the application of the aforementioned curable compositions onto a substrate followed by exposing the treated substrate with ultraviolet radiation.

Prior to the present invention, photocurable compositions such as Kehr et al. U.S. Pat. Nos. 3,697,395, 3,697,402 and 3,700,574, etc., showed that curable liquid polyenepolythiol mixtures could be converted to solid elastomeric products. As further discussed by Kehr et al in Division of Organic Coatings and Plastics Chemical, Vol. 33, No. 1, of Apr. 8–13, 1973, on page 295, the photocure of such polythiol-polyene system is identified as a free radical cure requiring an inhibitor to improve the shelf life of the composition. A photocuring rate accelerator is employed, such as benzophenone, to effect addition between the polyene component and the polythiol component resulting in the production of an elastomeric coating.

Although effective results can be achieved with the above-described free-radical initiated curing system of Kehr et al, a significant amount of inhibitor must be used to offset premature gellation. Experience has shown, however, that the use of inhibitors to improve the shelf life of the curable polythiol-polyene mixture also lengthens the cure time of the mixture. As shown by the above Kehr et al. patents, cure times of several minutes to several days are not unusual.

The present invention is based on the discovery that liquid polythiol-polyene mixtures can be converted to elastomeric solids by a condensation polymerization method. A photocurable mixture is provided which does not require the use of an inhibitor, and which can be cured to a coating having a thickness of up to 20 mils or more. A faster cure can be achieved by substituting an onium salt photoinitiator for the free radical photocuring rate accelerator of the prior art. Onium salts, such as triphenylsulfoniumfluoroborate, are capable of releasing a Lewis Acid catalyst upon exposure to ultraviolet light. Included among the preferred onium salts which can be used in the photocurable compositions of the invention, are compounds such as triarylsulfonium hexafluoroarsenate salts shown in my copending application Ser. No. 574,006 filed May 2, 1975, and assigned to the same assignee as the present invention. Additional onium salts useful in the present invention are shown in copending applications Ser. Nos. 466,375, 466,376 and 466,378, filed May 2, 1974 each of which is now abandoned, and assigned to the same assignee as the present invention. Although less effective than the aforedescribed onium salts because of the requirement of the need of a stabilizer, and undesirable side reactions, such as bubbling and discoloration due to nitrogen release, diazonium compounds such as shown by Schlesinger Patent 3,703,296, also provide for condensation polymerization based on the release of a Lewis Acid.

There are provided by the present invention, curable compositions comprising, a polyolefin component, a polythiol component, and an effective amount of an ultraviolet radiation photoinitiator of the formula, $$(Y^+)_J (MX_K)^{-(K-L)}, \quad (1)$$

where M is a metal or metalloid, and $Y^+$ is a cation selected from the class consisting of

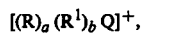

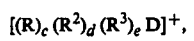

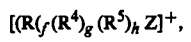

and R is a monovalent aromatic organic radical, $R^1$ is a divalent aromatic organic radical, $R^2$ is a monovalent organic aliphatic radical selected from alkyl, cycloalkyl and substituted alkyl, $R^3$ is a polyvalent organic radical forming a heterocyclic or fused ring structure selected from aliphatic radicals and aromatic radicals, $R^4$ is a monovalent organic aliphatic radical selected from alkyl, alkoxy, cycloalkyl and substituted derivatives thereof, $R^5$ is a polyvalent organic radical forming an aromatic heterocyclic or fused ring structure where Q and X are halogen radicals such as I, Br, Cl, F, etc., D is a Group VIa element selected from sulfur, selenium and tellurium, Z is a Group Va element selected from N, P, As, Sb and Bi, a is a whole number equal to 0 or 2, b is a whole number equal to 0 or 1, the sum of a + b is equal to 2 or the valence of Q, c is a whole number equal to 0 or 3, d is a whole number equal to 0 to 2, inclusive, e is a whole number equal to 0 or 1, where the sum of c + d + e is a value equal to 3 or the valence of D, f is a whole number equal to 0 to 4, inclusive, g is a whole number equal to 0 to 2, inclusive, h is a whole number equal to 0 to 2 inclusive and the sum of f + g + h is a value equal to 4 or the valence of Z,

J = K − L

L = valence of M and is an integer equal to 2 to 7, inclusive, and

K > L and is an integer having a value up to 8.

Radicals included by R can be the same or different, aromatic carbocyclic or heterocyclic radical having from 6 to 20 carbon atoms, which can be substituted with from 1 to 4 monovalent radicals selected from $C_{(1-8)}$ alkoxy, $C_{(1-8)}$ alkyl, nitro, chloro, etc., R is more particularly phenyl, chlorophenyl, nitrophenyl, methoxyphenyl, pyridyl, etc. Radicals included by $R^1$ are divalent radicals such as

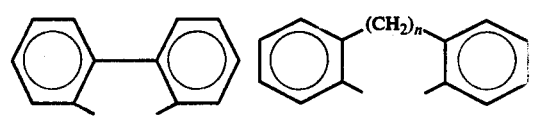

$R^2$ radicals include $C_{(1-8)}$ alkyl such as methyl, ethyl, etc., substituted alkyl such as $-C_2H_4OCH_3$, $-CH_2COOC_2H_4$, $-CH_2COCH_3$, etc. $R^3$ radicals include such structures as:

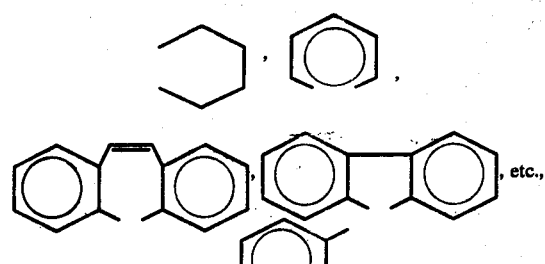

R⁴ radicals include $C_{(1-8)}$ alkyl, $C_{(3-8)}$ cycloalkyl, substituted alkyl such as haloalkyl, for example, chloroethyl; alkoxy such as $OCH_2C_6H_5$ and $OCH_3$; alkoxyalkyl such as $C_nH_{2n}OCH_3$, etc. Radicals included by R⁵ are, for example,

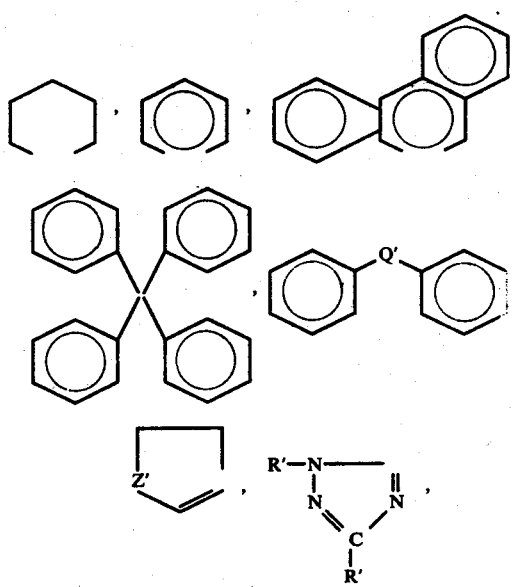

where Q' is selected from O, $CH_2$, N, R and S; Z' is selected from —O—, —S— and

and R' is a monovalent radical selected from hydrogen and hydrocarbon.

Metal or metalloids included by M of formula 1 are transition metals such as Sb, Fe, Sn, Bi, Al, Ga, In, Ti, Zr, Sc, V, Cr, Mn, Cs, rare earth elements such as the lanthanides, for example, Cd, Pr, Nd, etc., and metalloids such as B, P, As, etc. Complex anions included by $MQ'^{-(d-e)}$ are, for example, $BF_4^-$, $PF_6^-$, $AsF_6^-$, $SbF_6^-$, $FeCl_4^=$, $SnCl_6^-$, $SbCl_6^-$, $BiCl_5^=$, etc.

Halonium salts included by Formula 1 are, for example,

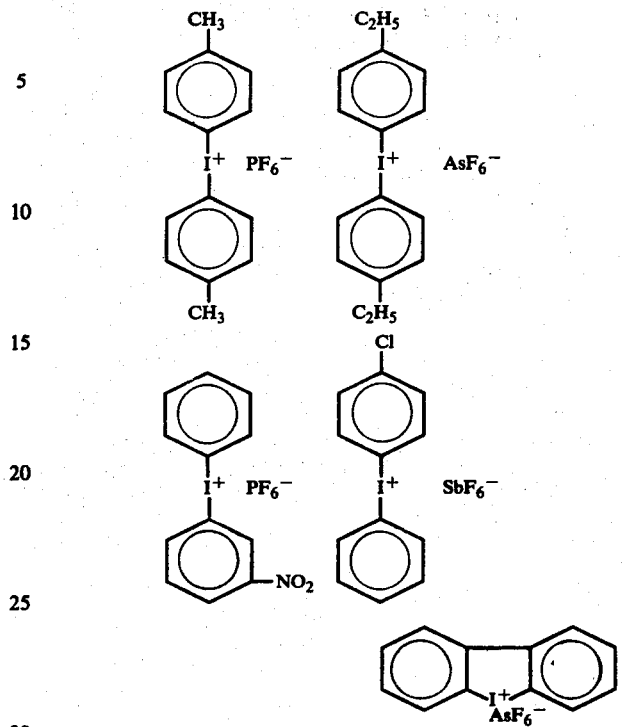

Group IVa onium salts included by Formula 1 are, for example,

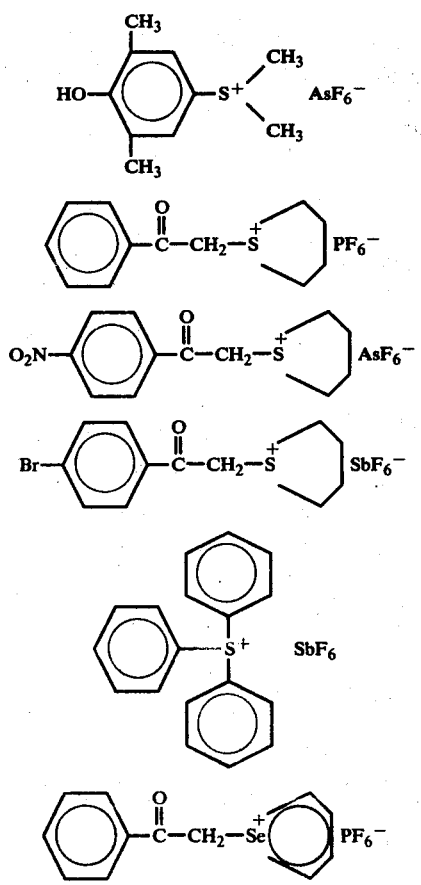

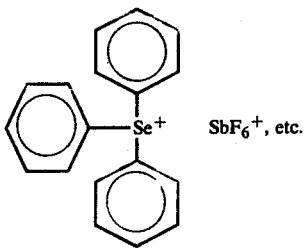

Group Va onium salts included by Formula 1 are, for example,

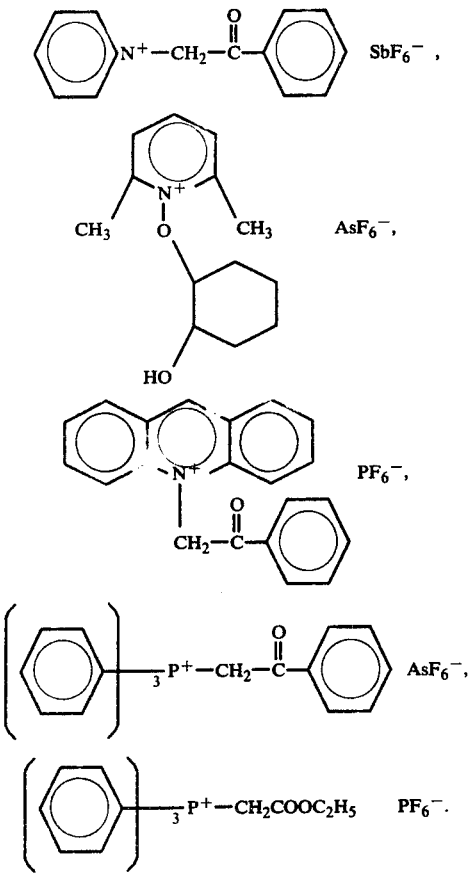

As shown in my copending application Ser. No. 574,007, filed May 2, 1975, now U.S. Pat. No. 3,981,897 and assigned to the same assignee as the present invention, some of the photoinitiators used in the curable compositions as the present invention can be made by effecting contact under aqueous conditions between an arylhalonium bisulfate and the corresponding hexafluoro acid or salt, such as $Y^1 M F_6$ where $Y^1$ can be hydrogen, an alkali metal ion, alkaline earth metal ion or transition metal ion.

In addition to the above-described metathesis for making the corresponding halonium salts, the halonium salts of the present invention also can be prepared by using silver compounds, such as silver oxide, or silver tetrafluoroborate, which were reacted with the appropriate diarylhalonium salt, as shown by M. C. Caserio et al., J. Am. Chem. Soc. 81, 336 (1959) or M. C. Beringer et al., J. Am. Chem. Soc. 81, 342 (1959). Methods for making Group VIa compounds, such as sulfonium, selenium and tellurium compounds, where Y of Formula 1 contains an X radical can be made by procedures shown in J. W. Knapczyk and W. E. McEwen, J. Am. Chem. Soc., 91 145, (1969); A. L. Maycock and G. A. Berchtold, J. Org. Chem., 35 No. 8,2532 (1970); H. M. Pitt, U.S. Pat. No. 2,807,647, E. Goethals and P. De Radzetzky, Bul. Soc. Chim. Belg., 73 546 (1964); H. M. Leicester and F. W. Bergstrom, J. Am. Chem. Soc., 51 3587 (1929), etc.

Among the procedures which can be used to make Group Va onium salts, arsonium, antimonium and bimuthonium salt, where Y in Formula 1 is a Z radical can be found in Goerdeler, Methoden der Organishen Chimie 11/2, 591–640 (1958) and K. Sasse, idid, 12/1 79–112 (1963).

Some of the polyolefins which can be used in the photocurable compositions of the present invention are shown by Kehr et al. U.S. Pat. No. 3,697,396, in Col. 3, Lines 5–55 and Col. 4, Lines 1–15. Generally any polyolefin can be used in the practice of the invention having the following formula, $$[A\text{+}D]_x \qquad (2)$$

where x is an integer having a value of at least 2, A is a polyvalent organic radical or an organosilicon radical free of reactive olefinic unsaturation consisting essentially of chemically combined atoms, such as carbon, oxygen, nitrogen, phosphorous, silicon, etc., and mixtures thereof in combination with monovalent atoms such as chlorine, bromine, fluorine, hydrogen, etc., and D is an olefinically unsaturated monovalent organic radical, including, but not limited to, radicals shown in Column 3, Lines 5–41 of Kehr et al. U.S. Pat. No. 3,697,396. Typical of the polyolefin components which can be used in the practice of the invention are polyurethanes formed by reacting poly(alkylene-ether) polyols with aliphatically unsaturated monoisocyanates, the aforementioned polyols reacted with unsaturated monoalcohols and organic polyisocyanates, etc. The preparation of the aforesaid polyurethanes are in accordance with standard procedures using organometallic catalysts, etc.

The polythiol component which can be used in the practice of the invention can have a molecular weight in the range of from 50 to about 20,000 and is included by the formula $$G\text{—}(SH)_y \qquad (3)$$

where G is a polyvalent organic radical, free of aliphatic unsaturation, and y is an integer having a value of at least 2 or greater. G is more particularly an organic radical which can contain hetero atoms such as N, P or O in addition to chemically combined carbon atoms, carbon and hydrogen atoms, carbon and oxygen atoms and silicon and oxygen atoms. Included among the polythiols are esters of thiol containing acids and polythiols such as ethanedithiol, hexamethylenedithiol, tolylene-2,4-dithiol and certain polymeric polythiols, such as thiol-terminated ethylcyclohexyldimercaptan polymer, etc., certain polythiol compounds are preferred because of relatively low odor level such as esters of thioglycolic acid, alpha-mercaptopropionic acid and beta-mercaptopropionic acid with polyhydroxy compounds such as glycols, triols, tetrols, pentols, hexols and the like. A few of the examples of the polythiols which can be employed in making the curable compositions of the present invention are: ethylene glycol bis(thioglycolate), ethyleneglycol bis($\beta$-mercaptopropionate), trimethylolpropane bis(thioglycolate), etc. The preferred polythiol compounds are characterized by being substantially free of mercaptan like odor, resulting in the production of substantially odor free coating products.

The curable composition of the present invention may be employed as compositions free of an organic solvent or used as a coating material at 100% solids containing the active ingredients of the polyolefin component and the polythiol and the photoinitiator as previously described. The curable compositions of the present invention can be applied onto a variety of substrates such as plastics, glass, wood, steel, aluminum, etc., as a dispersion, or an emulsion in an aqueous media. In addition, the curable compositions of the present invention can be pumped, poured, siphoned, brushed, sprayed, doctored, or otherwise applied on the aforementioned substrates in a desirable manner. The curable compositions also can be blended prior to cure with other monomeric and polymeric materials such as thermoplastic resins, elastomers of thermosetting resins to modify the curing characteristics of the resulting cured product.

It has been found that if prior to cure, substantial stochiometric equivalents of reactive functionality is maintained in the curable mixture of the polyolefinic components containing carbon to carbon double bond unsaturation, with S H containing radicals of the polythiol components, the resulting curable coating composition will have optimum coating characteristics. The mole ratio of ene to thiol groups in the UV curable composition can be from about 0.2/1 to about 5/1 and preferably from about 0.75/1 to about 1.5/1. Included among the desirable characteristics of the coating compositions of the present invention are, for example, flexibility, solvent resistance, weatherability, insulating characteristics, etc.

The order of addition of the various ingredients into the curable mixture is not critical. For example, the photoinitiator can be added directly or prepared in situ to the mixture of the polyolefin and the polythiol along with the aforementioned photoinitiator, which can be present in a proportion of from 0.25 to 10% by weight and preferably from 0.5 to 3% based on the weight of UV curable composition. There also can be utilized such additives as antioxidants, accelerators, dyes, inhibitors, activators, fillers, pigments, antistatic agents, flame retardant agents, thickeners, thixotropic agents, surface active agents, viscosity modifiers, extending oils, plasticizers, tackifiers and other ingredients normally used to modify the characteristics of a curable coating formulation. Fillers such as natural and synthetic resins, carbon black, alumina, wood flour, mica, silica, aluminum and a proportion of such additives such as in an amount of 500 parts or more per 100 parts of curable mixture can be used and preferably from about 0.5% to about 300 parts per 100 parts of the curable mixture. Conventional sources of the ultraviolet light such as medium pressure mercury arc lamps, e.g., Hanovia lamps and GE H3T7 lamps, type RS sunlamps, Xenon Flash lamps, carbon arc lamps, can be used effectively.

Among the uses of the curable compositions of the present invention are, for example, adhesives, calks, elastomeric sealants, coatings, incapsulating or potting compounds, liquid castable elastomers, thermoset resins, impregnants for fabric cloth, fibrous webs and other porous substrates, etc.

In addition, the curable compositions can be used as matrix materials for composites of glass fibers, carbon fibers, steel fibers, etc., thermosetting resins or elastomers as molding compounds to make gaskets, diaphrams, etc.

In order that those skilled in the art will be better able to practice the present invention, the following examples are given by way of illustration and not by way of limitation. All parts are by weight.

EXAMPLE 1

A sufficient amount of triphenyl sulfonium hexofluoro arsenate was added in crystalline form to an equal molar mixture of trimethylolpropane trithiolglycolate and diallylphthalate to produce a curable mixture having about 3% by weight of photoinitiator. The curable mixture was then applied onto the surface of a glass substrate by use of a drawbar to produce a coating of about 3 mils. The treated glass substrate was then placed under a GE HT37 medium pressure mercury arc lamp at a distance of about 6 inches. Cure of the curable mixture was achieved after about 1 minute exposure time which was determined by measuring the period of time the surface of the treated substrate was tack free.

EXAMPLE 2

An equal molar solution of trimethylolpropanoltriarylate and diallylmaleate was sensitized with about 3% by weight of triphenylsulfonium hexofluoroarsenate. The aforementioned curable composition was then applied by means of a drawbar onto the surface of a glass plate. The treated substrate was then exposed for 20 seconds under an ultraviolet source as described in Example 1 where by the surface of the treated substrate was rendered tack free.

EXAMPLE 3

Additional equal molar mixtures of a polyolefin component and a polythiol component were blended with about 3% by weight of photoinitiator and cured in accordance with the procedure of Example 1. The following table shows the ingredients in the mixture and the cure time which is measured in terms of rendering a treated glass substrate tack free after it has been treated with a 3 mil coating of the curable composition.

TABLE I

| Polyolefin | Polythiol | Photoinitiator | Cure Time |
| --- | --- | --- | --- |
| diallylcarbonate | trimethylolpropane trithiolglycolate | triphenylsulfonium tetrafluoroborate | 15 sec. |
| triallylisocyanurate | " | triphenylsulfonium hexafluoroborate | 10 sec. |

EXAMPLE 4

There is added dropwise at a temperature of 60° C., 0.6 mole of allyl alcohol to a mixture while it was being stirred of 95 g (0.2 mole) of hexamethylenediisocyanate and 3 to 4 drops of stanous octoate. After the mixture was refluxed for one hour it was placed under vacuum to remove unreacted allyl alcohol. There was then added 0.2 mole of trimethylolpropane trithiolglycolate. The resulting mixture was then equally divided and to each portion respectively there was added 3 percent by weight of triphenylsulfonium hexafluoroarsenate and 4-methoxydiphenyliodoniumfluoroborate. The resulting curable mixtures were then applied onto an aluminum substrate and cured within 3-5 seconds using a pyrex filtered Hanovia 450 W medium pressure arc lamp at a distance of 6 inches.

EXAMPLE 5

A mixture was prepared by combining 2 grams of diethyleneglycol divinylether with 1 gram of pentaerythritol tetra-3-mercaptopropionate and 3% by weight of the resulting mixture of triphenylsulfonium hexafluoroantimonate. The mixture was then subjected to ultraviolet irradiation from a GE H3T7 medium pressure arc lamp at a distance of about 6 inches. The cured 3 mil film was produced after 5 seconds irradiation.

EXAMPLE 6

Sufficient 4,4'-diisopropyliodonium hexafluoroarsenate was added to a mixture of 66% by weight of diallyl isophthalate and 33% by weight of pentaerythritol tetra-3-mercaptopropionate to produce a photocurable composition having about 3% by weight of photoinitiator. The photocurable mixture was then applied onto a steel substrate at a thickness of about 3 mils and irradiated in accordance with the Example 4 to produce a tack free film within 20 seconds.

EXAMPLE 7

There was added sufficient triphenylsulfonium hexafluoroarsenate to a mixture of pentaerythritol-tetra-3-mercaptopropionate and a polyolefin resulting from the reaction of 0.1 mole of bisphenol-A-diglycidylether and diallyl amine which had been reacted together for about 2 hours. The resulting curable mixture was irradiated for 5 seconds after it had been applied as a 3 mil film onto the surface of an aluminum substrate. Irradiation was performed in the same manner as previously described. There was obtained a tack free film suitable as an insulating coating or dielectric film for a capacitor.

EXAMPLE 8

The procedure of Example 7 was repeated except that there was incorporated into the mixture 0.5% by weight of 2,6-di-t-butyl-4-methylphenol as a stabilizer. Cure of the composition was again effected within 5 seconds. This established that the stabilizer did not interfere with the cure of the curable composition, indicating that the cure mechanism was not a free radical mechanism. Those skilled in the art would know that if the photoinitiator was benzophenone or other free radical photoinitiator as utilized in the above-described Kehr et al. patent that the inhibitor would have interfered with the cure rate of the curable composition.

Although the above examples illustrate only a few of the very many curable compositions which can be made in accordance with the present invention, it should be understood that the curable compositions of the present invention can be made by blending a photoinitiator of formula (1) with a polyolefin of formula (2) and polythiol of formula (3).

What I claim as new and desire to secure by Letters Patent of the United States is:

1. A UV curable composition substantially free of a free radical inhibitor consisting essentially of
   (A) A polyolefin component having the formula, $[A \!\!-\!\! D]_x$, where x is an integer having a value of at least 2, A is a polyvalent organic radical or an organisilicon radical free of reactive olefinic unsaturation and consisting essentially of chemically combined atoms selected from the class consisting of carbon, oxygen, nitrogen, phosphorous, silicon and mixtures thereof in combination with monovalent atoms selected from the class consisting of chlorine, bromine, fluorine and hydrogen and D is an olefinically unsaturated monovalent organic radical,
   (B) a polythio component having the formula, $G \!\!-\!\! (SH)_y$, where G is a polyvalent organic radical free of aliphatic unsaturation and y is an integer having a value of at least 2, and
   (C) from 0.25% to 10% by weight of the UV curable composition, of a photodecomposable cationic photoinitiator of the formula, $(Y^+)_j (MX_k)^{-(k-l)}$, where M is a metal or metalloid and $Y^+$ is a cation selected from the class consisting of $[(R)_a (R^1)_b I]^+$, $[(R)_c (R^2)_d (R^3)_e S]^+$, and $[(R)_f (R^4)_g (R^5)_h Z]^+$, R is a monovalent aromatic organic radical, $R^1$ is a divalent aromatic organic radical, $R^2$ is a monovalent organic aliphatic radical selected from alkyl, cycloalkyl and substituted alkyl, $R^3$ is a polyvalent organic radical forming a heterocyclic or fused ring structure selected from aliphatic radicals and aromatic radicals, $R^4$ is a monovalent organic aliphatic radical selected from alkyl, alkoxy, cycloalkyl and substituted derivatives thereof, $R^5$ is a polyvalent organic radical forming an aromatic heterocyclic or fused ring structure, X is a halogen radical selected from the class consisting of I, Br, Cl and F, Z is a Group Va element selected from the class consisting of N, P, As, Sb, and Bi, a is a whole number equal to 0 or 2, b is a whole number equal to 0 or 1, the sum of a + b is equal to 2 or the valence of I, c is a whole number equal to 0 or 3, d is a whole number equal to 0 or 2 inclusive, e is a whole number equal to 0 or 1, and the sum of c + d + e is a value equal to 3 or the valence of S, f is a whole number equal to 0 to 4, g is a whole number equal to 0 to 2 inclusive, h is a whole number equal to 0 to 2 inclusive, and the sum of f + g + h is a value equal to 4 or the valence of Z,
   j = k − l
   l = valence of M and is an integer equal to 2 to 7 inclusive and
   k>l and is an integer having a value up to 8.

2. A curable composition in accordance with claim 1, where the polyolefin component is diallyl phthalate.

3. A curable composition in accordance with claim 1, where the polyolefin component is diallyl maleate.

4. A curable composition in accordance with claim 1, where the polyolefin component is triallyl cyanurate.

5. A curable composition in accordance with claim 1, where the polythiol component is trimethylolpropane trithiolglycolate.

6. A curable composition in accordance with claim 1, where the polythiol component is pentaerythritol tetra-3-mercaptopropionate.

7. A curable composition in accordance with claim 1, where the photoinitiator is triphenylsulfonium hexafluoroaresnate.

8. A curable composition in accordance with claim 1, where the photoinitiator is 4,4'-dimethyldiphenyliodonium hexafluorophosphate.

9. A curable composition in accordance with claim 1, where the photoinitiator is triphenylsulfonium tetrafluoroborate.

10. A method for treating a substrate which comprises,
 (1) applying a UV curable composition onto the surface of the substrate and
 (2) exposing the treated substrate to ultraviolet light, where the UV curable composition is defined in claim 1.

* * * * *